(12) United States Patent  
Rafique et al.

(10) Patent No.: US 9,124,403 B2  
(45) Date of Patent: Sep. 1, 2015

(54) PUNCTURING SCHEME BASED DECODER OPTIMIZATIONS

(71) Applicant: QUALCOMM Incorporated, San Diego, CA (US)

(72) Inventors: Hassan Rafique, Farnborough (GB); Divaydeep Sikri, Farnborough (GB); Nico De Laurentiis, Farnborough (GB); Nita E. Joseph, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 117 days.

(21) Appl. No.: 13/975,051

(22) Filed: Aug. 23, 2013

(65) Prior Publication Data

US 2014/0325321 A1 Oct. 30, 2014

Related U.S. Application Data

(60) Provisional application No. 61/817,604, filed on Apr. 30, 2013.

(51) Int. Cl.
*H04L 1/00* (2006.01)
*H04W 88/02* (2009.01)
(Continued)

(52) U.S. Cl.
CPC ............ *H04L 1/0068* (2013.01); *H03M 13/23* (2013.01); *H03M 13/41* (2013.01); *H03M 13/6362* (2013.01); *H04L 1/0046* (2013.01);
(Continued)

(58) Field of Classification Search
CPC . H03M 13/6362; H03M 13/41; H03M 13/23; H04L 1/0046; H04L 1/0053; H04L 1/0059; H04L 1/0068; H04L 1/0069; H04W 88/02

USPC .......................................... 714/791, 794, 790
See application file for complete search history.

(56) References Cited

U.S. PATENT DOCUMENTS 6,392,572 B1 * 5/2002 Shiu et al. ........................ 341/81
6,845,482 B2 * 1/2005 Yao et al. ....................... 714/755
(Continued)

FOREIGN PATENT DOCUMENTS

WO WO-2007115324 A2 10/2007

OTHER PUBLICATIONS

Gu Pin-biao; Lennan Wu; Du Na, "Research on the Performance of OFDM Communication System Based on LDPC-BICM-ID Scheme," Information Processing (ISIP), 2010 Third International Symposium on , vol., No., pp. 198,202, Oct. 15-17, 2010.*
45 Mbps et al., "STEL1-2060C/CR", Jan. 1, 1999, XP055123316, p. 7. Retrieved from the Internet: URL:http://datasheet.elcodis.com/pdf2/86/80/868038/stel-2060cr.pdf [Retrieved on Jun. 13, 2014].

(Continued)

*Primary Examiner* — Cynthia Britt
(74) *Attorney, Agent, or Firm* — Loza & Loza LLP

(57) ABSTRACT

Systems and methods for decoding bitstreams are described. The bitstreams may be encoded using a punctured convolution code and received from a wireless network. A puncture pattern associated with a modulation and coding scheme used to encode the bitstream is determined, and punctured log-likelihood ratios (LLRs) generated from the bitstream are ignored while decoding the bitstream. The puncture pattern may be characterized by one or more algorithms that identify punctured LLRs in a repetitive sequence of LLRs. A decoder may exclude punctured LLRs from calculations related to bitstream decoding. The decoder may comprise a Viterbi decoder or an algebraic decoder. Other aspects, embodiments, and features are also claimed and described.

30 Claims, 14 Drawing Sheets

(51) Int. Cl.
    *H03M 13/00*     (2006.01)
    *H03M 13/23*     (2006.01)
    *H03M 13/41*     (2006.01)

(52) U.S. Cl.
    CPC ............ *H04L1/0053* (2013.01); *H04L 1/0069* (2013.01); *H04W 88/02* (2013.01); *H04L 1/0059* (2013.01)

(56) References Cited

U.S. PATENT DOCUMENTS

| | | | | |
|---|---|---|---|---|
| 6,885,711 | B2* | 4/2005 | Shiu et al. | 375/340 |
| 7,849,377 | B2* | 12/2010 | Hekstra et al. | 714/752 |
| 7,961,795 | B2* | 6/2011 | Fei et al. | 375/260 |
| 8,176,384 | B2 | 5/2012 | Myung et al. | |
| 8,910,028 | B1* | 12/2014 | Li et al. | 714/795 |
| 2007/0184806 | A1 | 8/2007 | Yang et al. | |
| 2010/0275089 | A1* | 10/2010 | Mow et al. | 714/752 |
| 2011/0190024 | A1 | 8/2011 | Seong et al. | |
| 2012/0093251 | A1* | 4/2012 | Nakamura et al. | 375/267 |
| 2012/0185757 | A1 | 7/2012 | Jeong et al. | |

OTHER PUBLICATIONS

Butler M R G et al., "Viterbi Decoding Strategies for 5 GHz Wireless LAN Systems",IEEE 54th Vehicular Technology Conference, Vtc Fall 2001. Proceedings Oct. 7-11, 2001, Atlantic City, NJ, (CAT. No. 01CH37211), IEEE P, vol. 1, Oct. 7, 2001, XP010562648, DOI: 10.1109/VTC.2001.956559 ISBN: 978-0-7803-7005-0.

International Search Report and Written Opinion—PCT/US2014/033171—ISA/EPO—Jul. 9, 2014.

Marazin M et al., "Algebraic Method for Blind Recovery of Punctured Convolutional Encoders from an Erroneous Bitstream" IET Signal Processing, The Institution of Engineering and Technology, Michael Faraday House, Six Hills Way, Stevenage, Herts, SG1 2AY, UK, vol. 6, No. 2, Apr. 10, 2012, XP006043225, ISSN: 1751-9675, DOI:10.1049/IET-SPR.2010.0343, pp. 122-131.

Morelos-Zaragoza R.H., "The Art of Error Correcting Coding Chapters 5 and 7", Jan. 1, 2006, XP055123297, p. 112-p. 115 pp. 143-146, Retrieved from the Internet: URL:http://onlinelibrary.wiley.com/ [retrieved on Jun. 13, 2014].

Chatzigeorgiou I.A., et al., "Performance Analysis and Design of Punctured Turbo Codes," Michaelmas 2006, 168 pages.

\* cited by examiner

Puncturing Pattern Depicted As A Matrix Of Locations Using The MCS5/P1

| k \ Poly. | 1 | 2 | 3 | 4 | 5 | 6 | 7 | 8 | 9 | 10 | 11 |
|---|---|---|---|---|---|---|---|---|---|---|---|
| $C_{3*k}$ | 100 | 100 | 100 | 100 | 100 | 100 | 100 | 100 | 100 | 100 | ... |
| $C_{3*k+1}$ | 100 | 100 | 100 | 100 | 100 | 100 | 100 | 100 | 100 | 100 | ... |
| $C_{3*k+2}$ | 0 | 0 | 0 | 0 | 0 | 0 | 0 | 0 | 0 | 0 | ... |

Columns (702)

Puncturing Pattern Matrix Corresponding To MCS6/P1

| k / Poly. | 1 | 2 | 3 | 4 | 5 | 6 | 7 | 8 | 9 | 10 | 11 |
|---|---|---|---|---|---|---|---|---|---|---|---|
| $C_{3*k}$ | 100 | 0 | 0 | 0 | 100 | 100 | 100 | 0 | 0 | 0 | 100 |
| $C_{3*k+1}$ | 0 | 100 | 0 | 0 | 100 | 0 | 0 | 100 | 0 | 0 | 100 |
| $C_{3*k+2}$ | 0 | 0 | 100 | 100 | 0 | 0 | 0 | 0 | 100 | 100 | 0 |

| k / Poly. | 12 | 13 | 14 | 15 | 16 | 17 | 18 | 19 | 20 | 21 | 22 |
|---|---|---|---|---|---|---|---|---|---|---|---|
| $C_{3*k}$ | 100 | 100 | 0 | 0 | 0 | 100 | 100 | 100 | 0 | 0 | ... |
| $C_{3*k+1}$ | 0 | 0 | 100 | 0 | 0 | 100 | 0 | 100 | 100 | 0 | ... |
| $C_{3*k+2}$ | 0 | 0 | 0 | 100 | 100 | 0 | 0 | 0 | 0 | 100 | ... |

Puncturing Pattern Matrix Corresponding To MCS7/P1

*FIG. 9*

Puncturing Pattern Matrix Corresponding To MCS8/P1

Puncturing Pattern Matrix Corresponding To MCS9/P1

| | $D_{len}$ | Worst Case | Puncturing-based LLR Comparison | Savings |
|---|---|---|---|---|
| MCS 5 | 468 | 5616 | 4056 | 1560 |
| MCS 6 | 612 | 7344 | 1544 | 5800 |
| MCS 7 | 468 | 5616 | 300 | 5316 |
| MCS 8 | 564 | 6768 | 156 | 6612 |
| MCS 9 | 612 | 7344 | 24 | 7320 |

Number Of Calculations Performed For MCS 5 – MCS 9

PUNCTURING SCHEME BASED DECODER OPTIMIZATIONS

CROSS-REFERENCE TO RELATED APPLICATIONS

This application claims priority to and the benefit of U.S. provisional patent application No. 61/817,604, titled, "Puncturing Scheme Based Decoder Optimizations" and filed in the U.S. Patent Office on Apr. 30, 2013, the entire content of which is incorporated herein by reference as is fully set forth below and for all applicable purposes.

TECHNICAL FIELD

The technology discussed below relates generally to wireless communication, and more specifically, to methods and devices for decoding convolutional codes used in wireless communications. By using the discussed technology, user experience can be improved by way of efficient use of power resources for a user's device (e.g., mobile phone) and improving communications between user devices and network devices.

BACKGROUND

Wireless communications systems are widely deployed to provide various types of communication content such as voice, video, packet data, messaging, broadcast, and so on. These systems may be accessed by various types of access terminals adapted to facilitate wireless communications. In some scenarios, multiple access terminals share available system resources (e.g., time, frequency, and power). Examples of these wireless communications systems include code-division multiple access (CDMA) systems, time-division multiple access (TDMA) systems, frequency-division multiple access (FDMA) systems and orthogonal frequency-division multiple access (OFDMA) systems. Sharing resources enables many users to access a communications network.

Access terminals accessing one or more wireless communications systems are increasingly popular. Consumers also often use power-hungry applications running on access terminals. Access terminals can be battery-powered and the amount of power a battery can provide between charges is generally limited. Access terminals are experiencing continually increasing demand on communications circuits and associated increases in processing required to decode data and voice bitstreams received at the access terminal. User experience can be improved by efficient power usage.

BRIEF SUMMARY OF SOME EXAMPLES

Various features and aspects of the present disclosure can facilitate efficient decoding of bitstreams encoded using a punctured convolution code. According to at least one aspect of the present disclosure, access terminals may include a communications interface and a storage medium coupled with a processing circuit. The processing circuit may be adapted to receive a transmission comprising a bitstream encoded according to a convolutional code, determine a puncture pattern associated with a Modulation and Coding Scheme (MCS) used to encode a message received in the bitstream, and decode the message without using a plurality of log-likelihood ratios (LLRs) identified by the puncture pattern as corresponding to punctured locations in the bitstream. The processing circuit may ignore the punctured LLRs generated from the bitstream while decoding the bitstream.

In an aspect of the disclosure, the determined puncture pattern comprises a pattern used to encode a bitstream received at a communications interface. The communications interface may be embodied in a modem and may comprise a wireless transmitter and a wireless receiver. The puncture pattern may be one of a plurality of puncture patterns associated with the MCS. The puncture pattern may be determined after identifying the MCS used to encode the bitstream.

In an aspect of the disclosure, a plurality of LLRs may be generated from the bitstream while the bitstream is being decoded. Certain LLRs corresponding to punctured LLRs defined in the puncture pattern may be ignored during decoding. An LLR may be ignored when a decoder does not include the LLR in calculations used to decode the bitstream. The decoder may be a Viterbi decoder. The decoder may be an algebraic decoder.

In an aspect of the disclosure, the puncture pattern may be characterized by one or more algorithms that can be used to identify punctured LLRs in a repetitive sequence of LLRs. The puncture pattern may be an incomplete pattern in that the sequence of LLRs identified by an algorithm includes at least one valid LLR.

In an aspect of the disclosure, a modem comprises a receiver circuit and a decoder coupled to the receiver circuit. The decoder circuit may be adapted to determine a puncture pattern in a bitstream received by the receiver circuit, and ignore a plurality of LLRs generated from the bitstream while decoding a message transmitted in the bitstream. The puncture pattern is typically associated with the MCS used to encode the message. The ignored plurality of LLRs may correspond to a plurality of punctured LLRs defined in the puncture pattern.

In an aspect of the disclosure, a modem comprises means for extracting a bitstream from a signal received from a wireless network, means for determining a puncture pattern associated with the MCS used to encode a message received in the bitstream, and means for decoding the message without using a plurality of LLRs identified by the puncture pattern as corresponding to punctured locations in the bitstream. Discussed below are components that can serve as the above means and implement the claimed functions. For example, processors and controllers discussed below can serve as means to implement the above claimed functions.

In an aspect of the disclosure, a computer-readable storage medium comprises programming for causing a processing circuit to determine a puncture pattern associated with the MCS used to encode a message received in a bitstream received from a wireless network, and decode the message without using a plurality of LLRs identified by the puncture pattern as corresponding to punctured locations in the bitstream.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

FIG. 7 is a table illustrating an example of puncturing in an MCS6 encoded bitstream according to some embodiments of the present invention.

FIG. 9 is a table illustrating an example of puncturing in an MCS7 encoded bitstream according to some embodiments of the present invention.

DETAILED DESCRIPTION

The description set forth below in connection with the appended drawings is intended as a description of various configurations and is not intended to represent the only configurations in which the concepts and features described herein may be practiced. The following description includes specific details for the purpose of providing a thorough understanding of various concepts. However, it will be apparent to those skilled in the art that these concepts may be practiced without these specific details. In some instances, well known circuits, structures, techniques and components are shown in block diagram form to avoid obscuring the described concepts and features.

The various concepts presented throughout this disclosure may be implemented across a broad variety of telecommunication systems, network architectures, and communication standards. Certain aspects of the discussions described below are described in relation to Global System for Mobile Communications (GSM), and in relation to 3rd Generation Partnership Project (3GPP) protocols and systems, and related terminology may be found in much of the following description. However, those of ordinary skill in the art will recognize that one or more aspects of the present disclosure may be employed and included in one or more other wireless communication protocols and systems.

Certain techniques described herein can be applied in a variety of wireless communication systems, including CDMA systems, TDMA systems, FDMA systems, OFDMA systems, single carrier-frequency division multiple access (SC-FDMA) systems, and other such systems, and the terms "system" and "network" may be used interchangeably herein. A CDMA system can implement a radio technology such as Universal Terrestrial Radio Access (UTRA), which includes Wideband-CDMA (W-CDMA) and other variants of CDMA, and CDMA2000, which covers IS-2000, IS-95, and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM, etc. UTRA and E-UTRA are part of Universal Mobile Telecommunication System (UMTS), and/or 3GPP Long Term Evolution (LTE) which is a version of UMTS that uses E-UTRA, which employs OFDMA on the downlink and SC-FDMA on the uplink. UTRA, E-UTRA, UMTS, LTE and GSM are described in documents from the "3rd Generation Partnership Project" (3GPP) organization. Additionally, CDMA2000 and UMB are defined in standards promulgated by the "3rd Generation Partnership Project 2" (3GPP2) organization. Wireless communication systems may also include peer-to-peer (e.g., mobile-to-mobile) ad hoc network systems, using unpaired unlicensed spectrums, wireless LAN, Bluetooth and any other wireless communication technologies.

Figure 1:
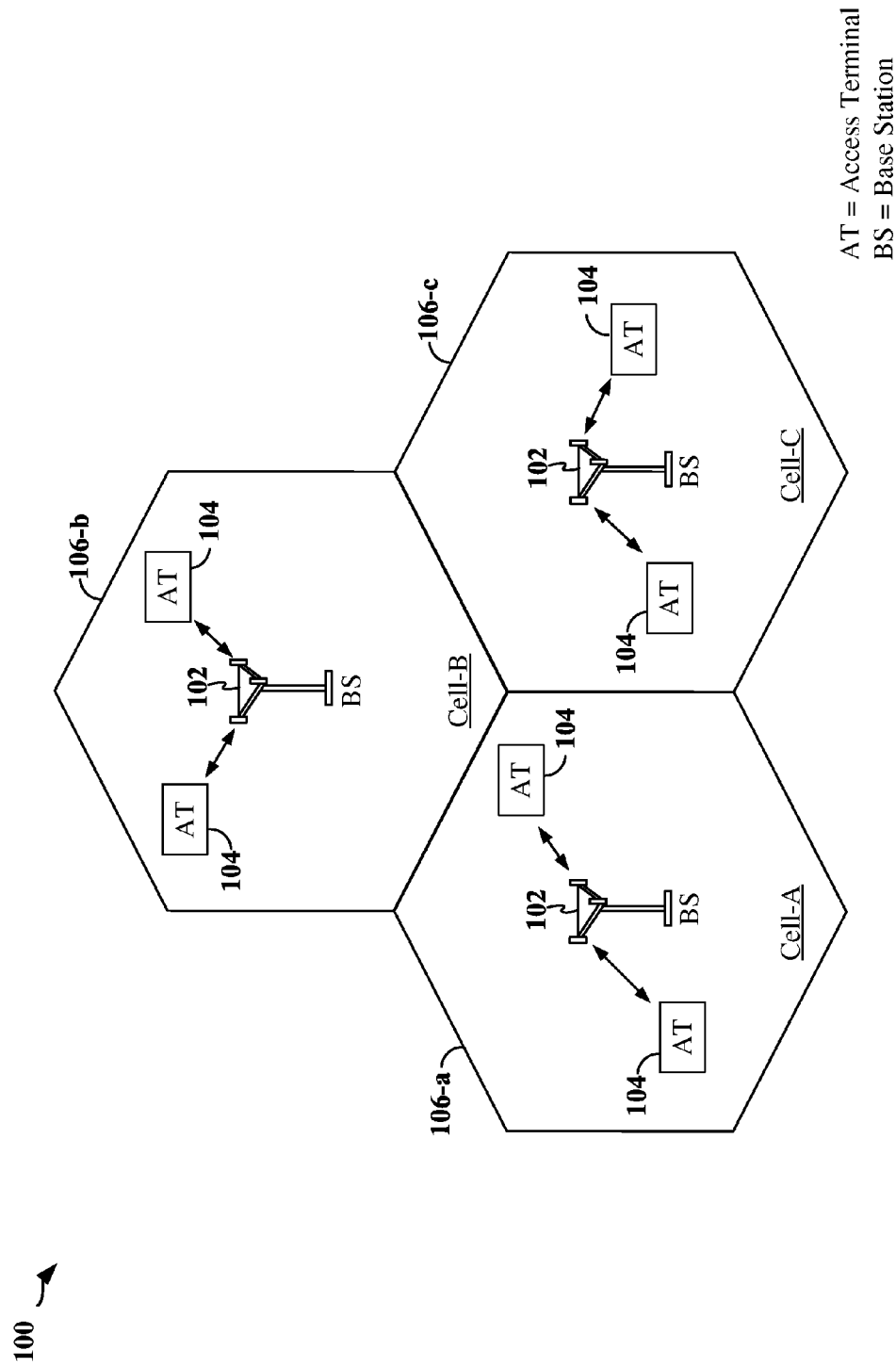
FIG. 1 is a block diagram illustrating an example of a network environment in which one or more aspects of the present disclosure may find application.

FIG. 1 is a diagram illustrating a network environment in which one or more aspects of the present disclosure may find application. A wireless communications system 100 includes base stations 102 adapted to communicate wirelessly with one or more access terminals 104. The system 100 may support operation on multiple carriers (waveform signals of different frequencies). Multi-carrier transmitters can transmit modulated signals simultaneously on the multiple carriers. Each modulated signal may be a CDMA signal, a TDMA signal, an OFDMA signal, a SC-FDMA signal, etc. Each modulated signal may be sent on a different carrier and may carry control information (e.g., pilot signals), overhead information, data, etc.

The base stations 102 can wirelessly communicate with the access terminals 104 via a base station antenna. The base stations 102 may each be implemented generally as a device adapted to facilitate wireless connectivity (for one or more access terminals 104) to the wireless communications system 100. The base stations 102 can additionally include one or more transmitter (Tx) chains and receiver (Rx) chains. Each Tx chain and Rx chain may include a plurality of components associated with signal transmission and reception, including antennas, processors, modulators, multiplexers, demodulators, demultiplexers, for example.

The base stations 102 may be configured to communicate with the access terminals 104 under the control of a base station controller (BSC) 206 (see FIG. 2) using a plurality of carriers. Each of the base stations 102 may be sited such that it can provide communication coverage for a respective geographic area. The coverage area 106 for each base station 102 here is identified as cells 106-a, 106-b or 106-c. The coverage area 106 for a base station 102 may be divided into sectors (not shown, but making up only a portion of the coverage area). The system 100 may include base stations 102 of different types (e.g., macro, micro, and/or pico base stations).

One or more access terminals 104 may be dispersed throughout the coverage areas 106. Each access terminal 104 may communicate with one or more base stations 102. An access terminal 104 may generally include one or more devices that communicate with one or more other devices through wireless signals. Such an access terminal 104 may also be referred to by those skilled in the art as a user equipment (UE), a mobile station (MS), a subscriber station, a mobile unit, a subscriber unit, a wireless unit, a remote unit, a mobile device, a wireless device, a wireless communications device, a remote device, a mobile subscriber station, a mobile terminal, a wireless terminal, a remote terminal, a handset, a terminal, a user agent, a mobile client, a client, or some other suitable terminology. An access terminal 104 may include a mobile terminal and/or an at least substantially fixed terminal. Examples of an access terminal 104 include a mobile phone, a pager, a wireless modem, a personal digital assistant, a personal information manager (PIM), a personal media player, a palmtop computer, a laptop computer, a tablet computer, a television, an appliance, an e-reader, a digital video recorder (DVR), a machine-to-machine (M2M) device, and/or other communication/computing device which communicates, at least partially, through a wireless or cellular network.

Figure 2:
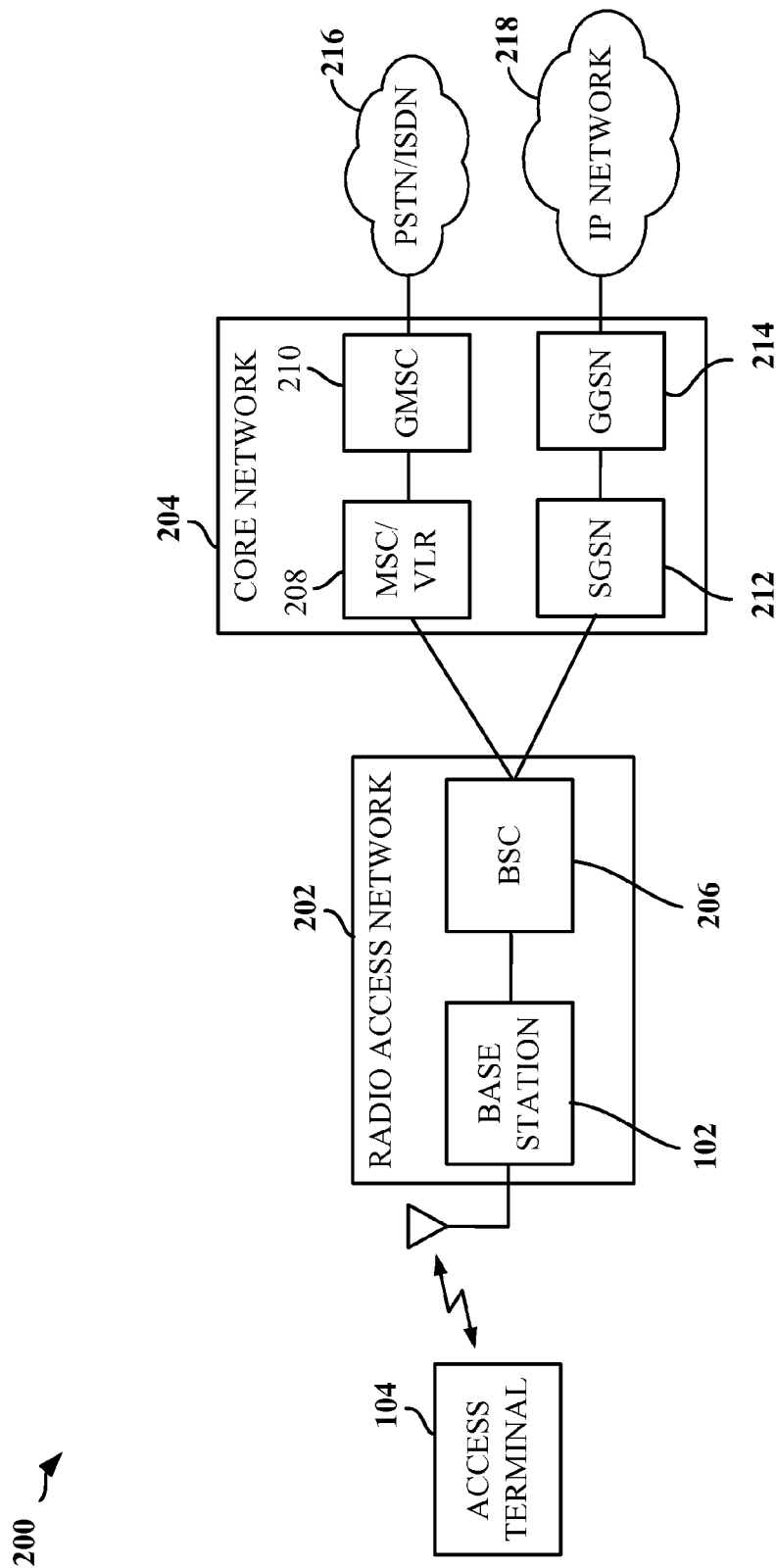
FIG. 2 is a block diagram illustrating select components of the wireless communications system of FIG. 1 according to at least one example.

FIG. 2 includes a block diagram representing a network environment 200 that illustrates certain aspects and components of the wireless communication system 100 depicted the example depicted in FIG. 1. As illustrated, the base stations 102 are included as at least a part of a radio access network (RAN) 202. The RAN 202 is generally adapted to manage traffic and signaling between one or more access terminals 104 and one or more other network entities, such as network entities included in a core network 204. The radio access network 202 may, according to various implementations, be referred to by those skill in the art as a base station subsystem (BSS), an access network, a GSM Edge Radio Access Network (GERAN), etc.

In addition to one or more base stations 102, the radio access network 202 can include a BSC 206, which may also be referred to by those of skill in the art as a radio network controller (RNC) or the like. The BSC 206 is generally responsible for the establishment, release, and maintenance of wireless connections within one or more coverage areas associated with the one or more base stations 102 that are connected to the BSC 206. The BSC 206 can be communicatively coupled to one or more nodes or entities of the core network 204.

The core network 204 is a portion of the wireless communications system 100 that provides various services to access terminals 104, which are connected via the radio access network 202. The core network 204 may include a circuit-switched (CS) domain and a packet-switched (PS) domain. Some examples of circuit-switched entities include a mobile switching center (MSC) and visitor location register (VLR), identified as MSC/VLR 208, as well as a Gateway MSC (GMSC) 210. Some examples of packet-switched elements include a Serving GPRS Support Node (SGSN) 212 and a Gateway GPRS Support Node (GGSN) 214. Other network entities may be included, such as an equipment identity register (EIR), home location register (HLR), visitor location register (VLR) and authentication center (AuC), some or all of which may be shared by both the circuit-switched and packet-switched domains. An access terminal 104 can obtain access to a public switched telephone network (PSTN) 216 via the circuit-switched domain, and to an IP network 218 via the packet-switched domain.

In some examples, to increase the robustness and resistance to errors that may occur, data communicated between a base station 102 and an access terminal 104 operating within the wireless communications system 100 may be encoded using an error-correcting encoder to produce a bitstream that may be transmitted over a communications channel. In a convolutional encoder, for example, m-bit information strings are encoded into n-bit symbols where n≥m. To reduce the number of transmitted symbols the encoded bitstream may additionally be punctured, whereby one or more bits may be suppressed, nulled, deleted or otherwise rendered void of information.

Figure 3:
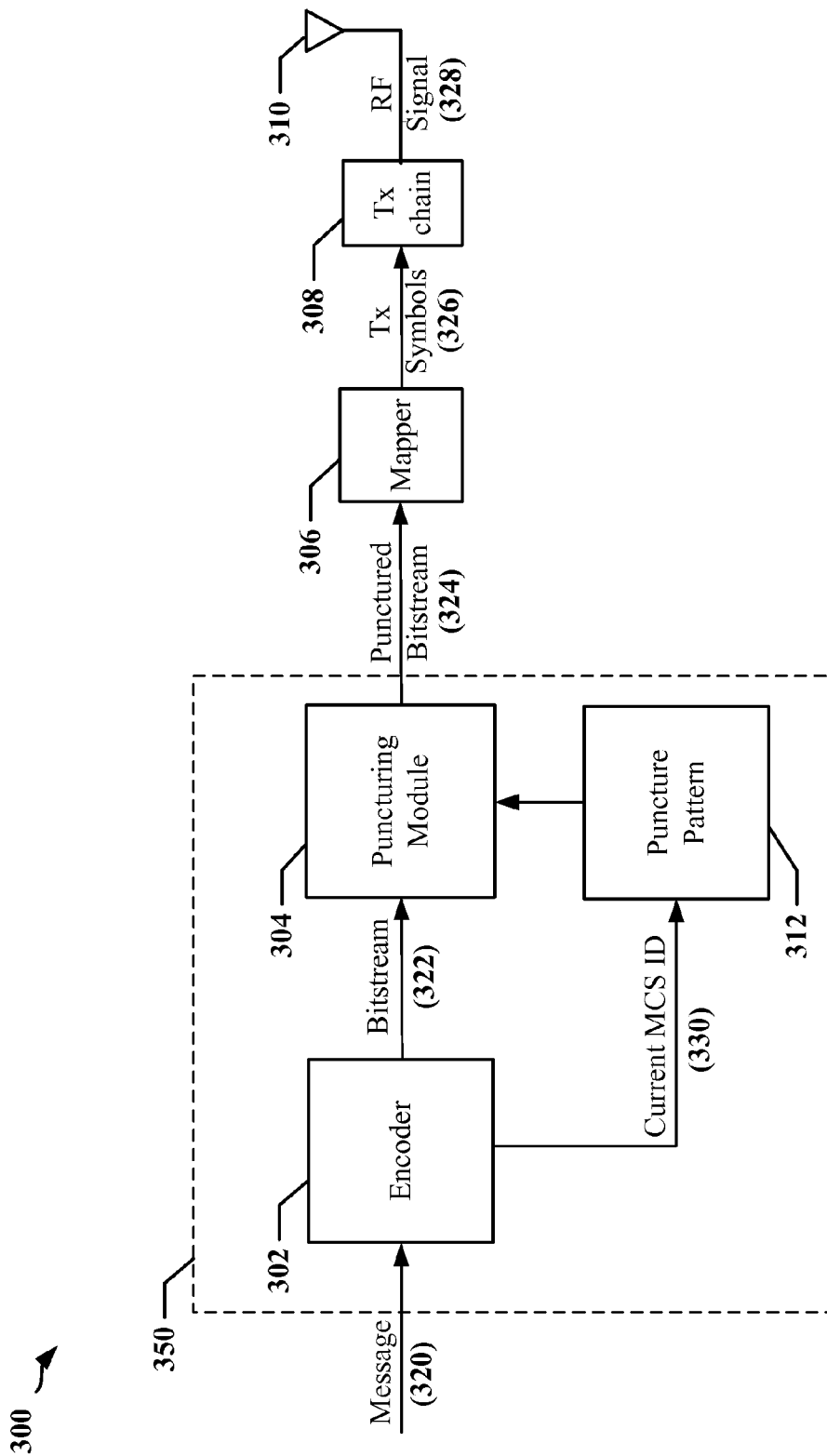
FIG. 3 is a simplified block diagram illustrating a puncturing encoder according to some embodiments of the present invention.

FIG. 3 is a simplified block diagram 300 illustrating a portion of a radio frequency (RF) modem 350 that may be configured to provide a signal including a punctured encoded message for wireless transmission. In one example, a convolutional encoder 302 in a base station 102 (or an access terminal 104 on the reverse path) receives a message 320 for transmission. The message 320 may contain data and/or encoded voice or other content directed to the receiving device. The encoder 302 encodes the message using a suitable modulation and coding scheme (MCS), typically selected based on a configuration defined by the base station 102 or another network entity. An encoded bitstream 322 produced by the encoder 302 may then be selectively punctured by a puncturing module 304, which may be a separate device or component, or which may be integrated with the encoder 302. The puncturing module 304 may determine that the bitstream should be punctured prior to transmission, or transmitted without puncturing. The decision to puncture the bitstream 322 is typically made based on network conditions, network configuration, RAN defined preferences and/or for other reasons. The bitstream 322 may be punctured according to a puncture pattern 312, which may be selected from one or more puncture patterns available for the MCS identified by an MCS ID 330 and used to encode the message 320. The puncturing module 304 provides an output 324 to a mapper 306 that generates a sequence of Tx symbols 326 that are modulated, amplified and otherwise processed by Tx chain 308 to produce an RF signal 328 for transmission through antenna 310.

The output 324 of the puncturing module 304 may be the unpunctured bitstream 322 or a punctured version of the bitstream 322, according to whether the modem portion 350 is configured to puncture the bitstream 322. In one example, parity and/or other error correction bits may be punctured in the output 324 of the encoder 302 in order to transmit the message 320 within a limited bandwidth of the RF channel. In another example, the bitstream may be punctured to reduce the power needed to transmit the message 320, to avoid interference, or for other network-related reasons.

Figure 4:
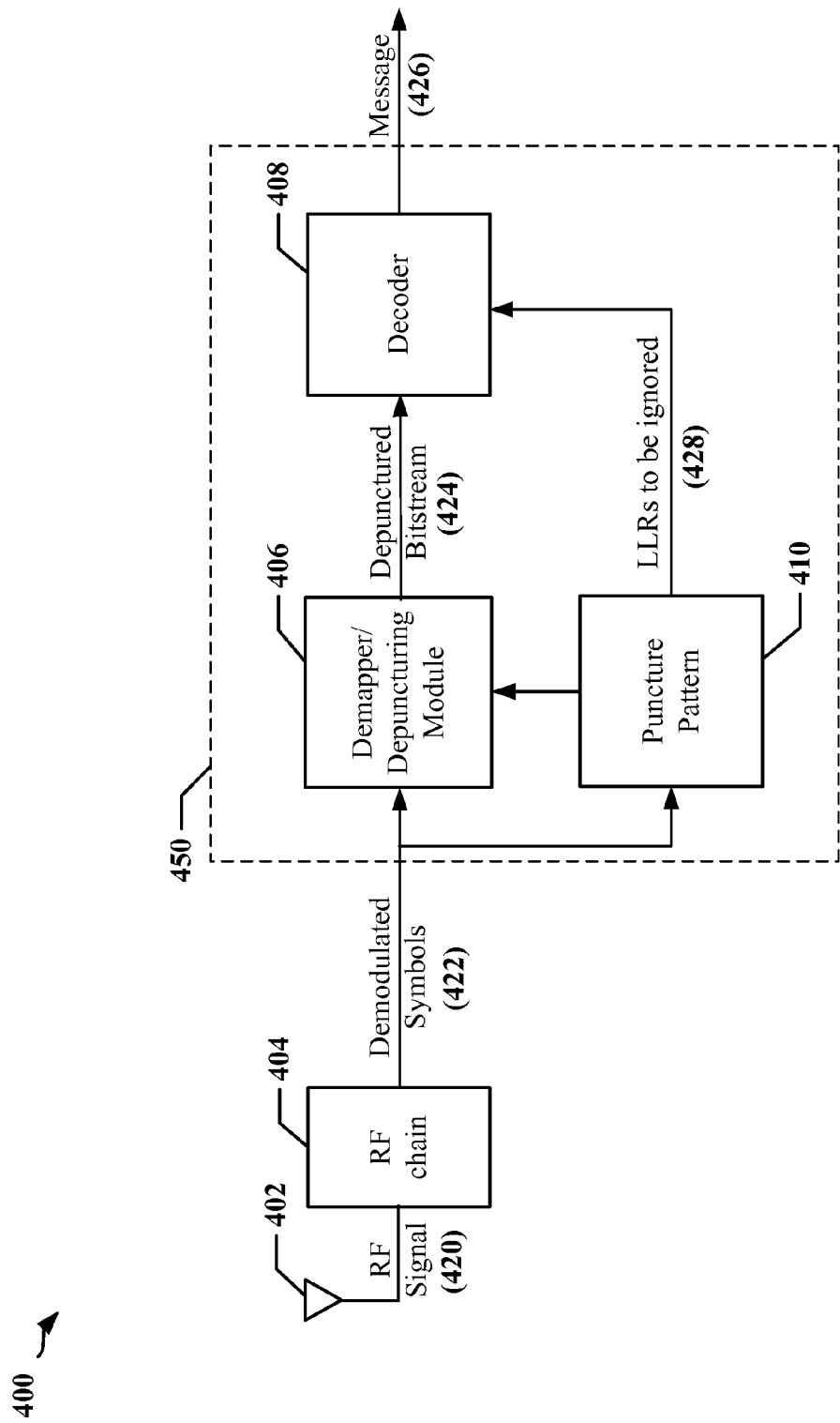
FIG. 4 is a simplified block diagram illustrating a decoder according to some embodiments of the present invention.

FIG. 4 is a simplified schematic 400 illustrating a portion of a radio frequency (RF) modem 450 that may be configured to receive and decode a wirelessly transmitted signal including a punctured encoded message. In various examples, the modem 450 receiving the signal may reside at the access terminal 104, at the base station 102, or at any other suitable apparatus or means for carrying out the described functions. An antenna 402 provides an RF signal 420 to an access terminal 104. An RF chain 404 processes and demodulates the RF signal 420 and may provide a sequence of symbols 422 to a demapper 406, which produces a bitstream 424 representative of the encoded message. The demapper 406 may provide a depunctured bitstream 424. In one example, the demapper 406 may include a depuncturing module that can be configured to insert null values at locations in the bitstream at which punctured bits were deleted by the transmitter. The depuncturing module may be used when the puncture pattern 410 used to produce the punctured bitstream at the transmitter is known. According to certain aspects disclosed herein, the puncture pattern 410 can be used to identify log-likelihood ratios (LLRs) 428 that may be ignored during decoding of the bitstream 424 by the convolutional decoder 408. The LLRs may be associated with a set of depunctured bit locations in the bitstream 424. Accordingly, the decoder 408 may produce the decoded message 426 with reduced processing overhead by ignoring the identified LLRs 428.

According to certain aspects disclosed herein, processing efficiency of a decoder 408 may be improved by configuring the decoder 408 to ignore LLRs 428 that correspond to punctured bits in a message transmitted in a punctured bitstream 422. The punctured bitstream 422 may have been punctured according to a puncturing scheme that defines certain bits to be removed from an encoded message. In one example, certain parity or other error-correction bits may be removed. The puncturing scheme may provide one or more puncturing patterns for each MCS supported by the communication network. A puncturing pattern may be expressed in a puncturing matrix or table that identifies the location of bits to be punctured in each message. In the example of convolutional encoded messages in a GERAN, the bitstream may be encoded using one of 9 or more different MCSs, and each MCS encoded bitstream may be punctured according to a selected puncturing scheme prior to transmission. A puncturing scheme may be selected to reduce processing overhead required to decode the message 426 while maintaining compliance with data rates on the communication channel and/or with transmission power limitations set by the network. A resultant punctured bitstream typically exhibits the error-correcting characteristics of a high rate error-correction code, but with less redundancy. Accordingly, puncturing may be effectively employed to reduce processing overhead at the decoder 408 in the receiver when channel conditions produce a relatively high signal to noise ratio.

A convolutional decoder 408 may be used to decode m-bit information strings from a bitstream that has been encoded using a convolutional code. The decoder 408 may comprise a Viterbi decoder, an algebraic decoder, or another suitable decoder. In one example, a Viterbi decoder employs the well-known Viterbi algorithm to find the most likely sequence of signaling states (the Viterbi path) that corresponds to a received bitstream 424. The bitstream 424 may be decoded based on a statistical analysis of LLRs calculated for the bitstream 424. In one example, a Viterbi decoder may compare and select the correct Viterbi path that defines a sequence of signaling states using a likelihood ratio test to generate LLRs from the bitstream 424. Likelihood ratios can be used to statistically compare the fit of a plurality of candidate Viterbi paths using a likelihood ratio test that compares the logarithm of a likelihood ratio for each candidate Viterbi path (i.e. the LLR) to determine which path is more likely to account for the sequence of symbols that produced the bitstream 424.

At the receiver, the same decoder used for decoding non-punctured bitstreams can typically be used for decoding punctured bitstreams, regardless of how many bits have been punctured. In conventional receivers, the LLR information is typically de-punctured before decoding is attempted by filling LLRs for punctured states or positions (de-punctured LLRs) with zeros. A conventional decoder may waste processing cycles and power by considering de-punctured LLRs that effectively carry no information.

According to certain aspects described herein, decoder performance may be optimized by avoiding the inclusion of de-punctured LLRs 428 in the decode process. Optimizations may be obtained by adapting the decoder 408 to recognize that a bitstream 422 is punctured based on information received from the network and/or a transmitter. In some instances, the decoder 408 may recognize a punctured bitstream 422 by identifying puncturing patterns 410 corresponding to the bitstream 422. The decoder 408 may use information defining puncturing patterns 410 to avoid consideration of de-punctured LLRs 428, which carry no information that is useful to the decoding process. Pattern recognition may be algorithmic in nature, and the puncture pattern 410 may be confirmed when punctured locations are found as predicted by one or more pattern recognition algorithms. The use of pattern recognition algorithms allows the decoder 408 to operate more efficiently because the decoder need not expend processing cycles to generate and consider LLRs that have no useful information and the decoder 408 need not store large tables and/or matrices defining states and locations that are punctured.

According to certain aspects disclosed herein, a receiver may detect a puncturing pattern 410 based on knowledge of the encoding and puncturing schemes employed. When the decoder ascertains that a received bitstream 422 is punctured according to a known pattern, the decoder may adapt one or more algorithms to ignore LLRs 428 corresponding to punctured locations in the bitstream 422. Consequently, the decoder 408 may refrain from performing calculations using de-punctured LLRs 428, and thereby reduce the number of processing cycles executed by the decoder 408.

According to certain aspects disclosed herein, the decoder 408 may determine which LLRs should be ignored from the puncturing pattern 410 used to puncture a received bitstream 422. The puncture pattern 410 may be described in a table (see FIGS. 5, 7, 9, 10 and 11) and/or may be characterized algorithmically, as illustrated in Table 1. In Table 1, puncturing patterns are described algorithmically for 5 different MCSes, including MCSes labeled MCS5, MCS6, MCS7, MCS8 and MCS9, which may correspond to certain MCSes used in a GERAN, for example. It will be appreciated from a review of the algorithms shown in Table 1 that some of puncturing patterns may not have perfect structure, in that the puncturing locations may not be uniformly distributed and that certain bits in a cyclic sequence of bit locations may be excepted from puncturing. Puncturing patterns may be defined by algorithm as comprising a plurality of cycles. The patterns defined for MCS5, for example, include a first substantially cyclic pattern that spans approximately 1400 locations and a second cyclic pattern that spans only a portion of the 1400 locations.

TABLE 1

| Coding/Punc. | Transmitted or Not Transmitted |
|---|---|
| MCS5/P1: | $\{C(2 + 9j)$ for $j = 0, 1, \ldots, 153\}$ and $\{C(1388 + 3j)$ for $j = 0, 1, \ldots, 5\}$ not transmitted, except $\{C(k)$ for $k = 47, 371, 695, 1019\}$ transmitted |

TABLE 1-continued

| Coding/Punc. | Transmitted or Not Transmitted |
|---|---|
| MCS5/P2: | {C(1 + 9j) for j = 0, 1, . . . , 153} and {C(1387 + 3j) for j = 0, 1, . . . , 5} not transmitted, except (C(k) for k = 136, 460, 784, 1108} transmitted |
| MCS6/P1: | {C(2 + 3j) for j = 0, 1, . . . , 611} not transmitted, except {C(k) for k = 32, 98, 164, 230, 296, 428, 494, 560, 626, 692, 824, 890, 956, 1022, 1088, 1220, 1286, 1352, 1418, 1484, 1616, 1682, 1748, 1814} are transmitted |
| MCS6/P2: | {C(1 + 3j) for j = 0, 1, . . . , 611} not transmitted, except {C(k) for k = 16, 82, 148, 214, 280, 412, 478, 544, 610, 676, 808, 874, 940, 1006, 1072, 1204, 1270, 1336, 1402, 1468, 1600, 1666, 1732, 1798} are transmitted |
| MCS7/P1: | {C(18j), C(1 + 18j), C(4 + 18j), C(8 + 18j), C(11 + 18j), C(12 + 18j), C(13 + 18j), C(15 + 18j) for j = 0, 1, . . . , 77} are transmitted, except {C(k) for k = 1, 19, 37, 235, 415, 595, 775, 955, 1135, 1351, 1369, 1387} which are not transmitted |
| MCS7/P2: | {C(2 + 18j), C(3 + 18j), C(5 + 18j), C(6 + 18j), C(10 + 18j), C(14 + 18j), C(16 + 18j), C(17 + 18j) for j = 0, 1, . . . , 77} are transmitted, except {C(k) for k = 16, 34, 52, 196, 376, 556, 736, 916, 1096, 1366, 1384, 1402} which are not transmitted |
| MCS7/P3: | {C(2 + 18j), C(5 + 18j), C(6 + 18j), C(7 + 18j), C(9 + 18j), C(12 + 18j), C(13 + 18j), C(16 + 18j) for j = 0, 1, . . . , 77} are transmitted, except {C(k) for k = 13, 31, 49, 301, 481, 661, 841, 1021, 1201, 1363, 1381, 1399} which are not transmitted |
| MCS8/P1: | {C(36j), C(2 + 36j), C(5 + 36j), C(6 + 36j), C(10 + 36j), C(13 + 36j), C(16 + 36j), C(20 + 36j), C(23 + 36j), C(24 + 36j), C(27 + 36j), C(31 + 36j), C(35 + 36j), for j = 0, 1, . . . , 46} and {C(845)} are transmitted |
| MCS8/P2: | {C(1 + 36j), C(4 + 36j), C(8 + 36j), C(11 + 36j), C(12 + 36j), C(15 + 36j), C(17 + 36j), C(19 + 36j), C(22 + 36j), C(25 + 36j), C(28 + 36j), C(30 + 36j), C(33 + 36j), for j = 0, 1, . . . ,46} and {C(582)} are transmitted |
| MCS8/P3: | {C(2 + 36j), C(3 + 36j), C(7 + 36j), C(9 + 36j), C(14 + 36j), C(17 + 36j), C(18 + 36j), C(21 + 36j), C(26 + 36j), C(27 + 36j), C(29 + 36j), C(32 + 36j), C(34 + 36j), for j = 0, 1, . . . , 46} and {C(1156)} are transmitted |
| MCS9/P1: | {C(3j) for j = 0, 1, . . . , 611} are transmitted |
| MCS9/P2: | {C(1 + 3j) for j = 0, 1, . . . , 611} are transmitted |
| MCS9/P3: | {C(2 + 3j) for j = 0, 1, . . . , 611} are transmitted |

Figure 5:
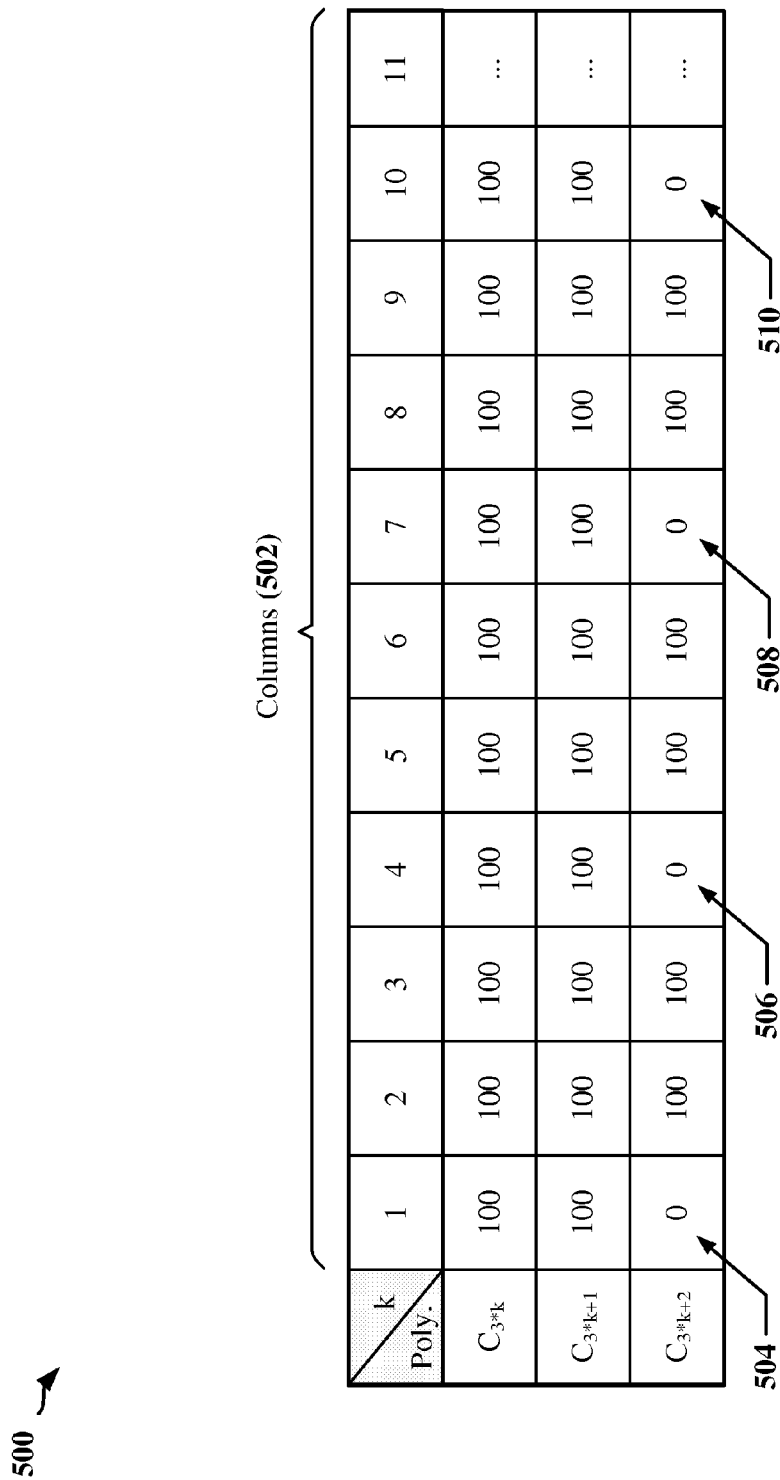
FIG. 5 is a table illustrating an example of puncturing in an MCS5 encoded bitstream according to some embodiments of the present invention.
Figure 6:
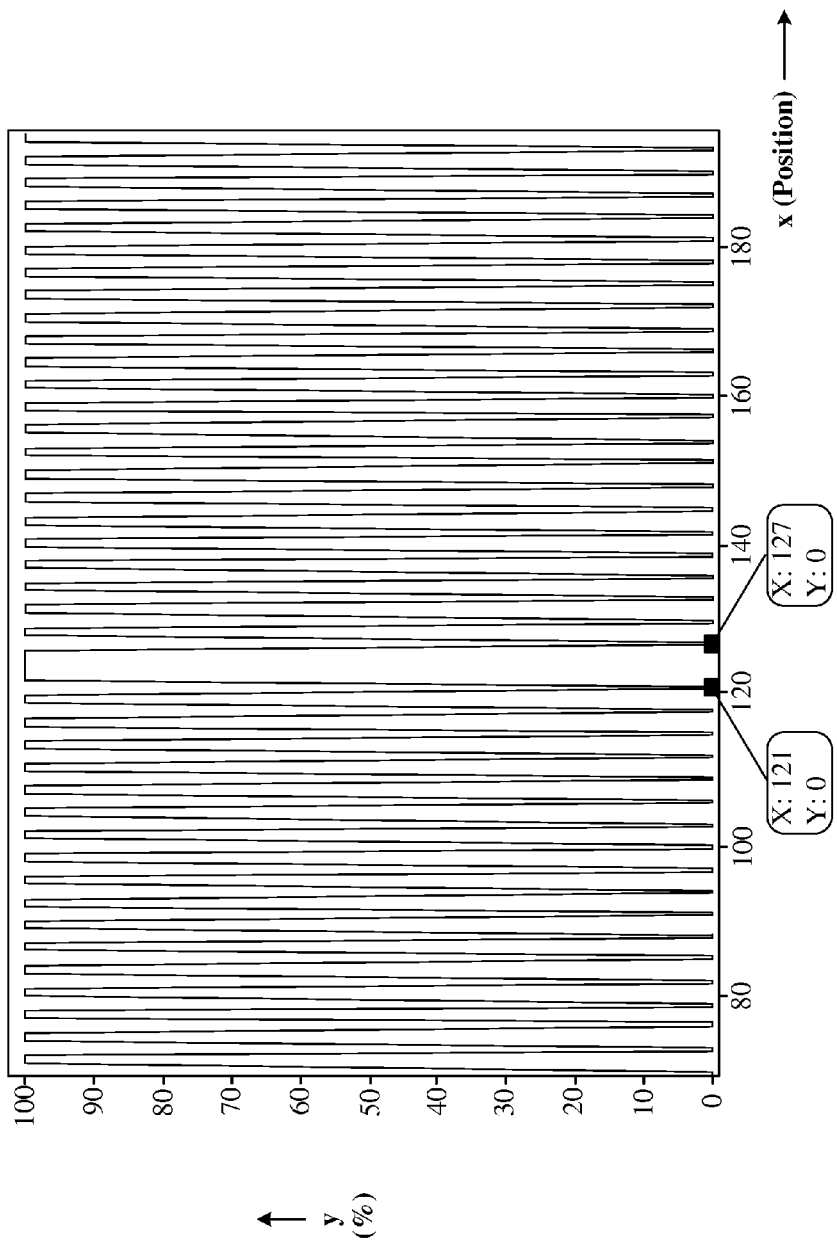
FIG. 6 is a graphical representation of a puncture pattern for the MCS5 encoded bitstream of FIG. 5 according to some embodiments of the present invention.

FIG. 5 illustrates an example of a puncturing pattern 500 depicted as a matrix of locations using the MCS5/P1 puncturing pattern shown in Table 1. In the MCS5/P1 pattern, puncturing occurs at positions defined by {C(2+9j) for j=0, 1, . . . , 153} and {C(1388+3j) for j=0, 1, . . . , 5} and a punctured LLR 504, 506, 508, 510 occurs in one of the polynomials (i.e., in every third column 502), except for the positions defined by {C(k) for k=47, 371, 695, 1019}. Thus, for k=0, the LLR 504 indicated by ($C_{3*3+2=2}$) is zero, for k=1, the LLR 506 indicated by ($C_{9*1+2=11}$) is zero, for k=2, the LLR 508 indicated by ($C_{9*2+2=20}$) is zero, for k=3, the LLR 510 indicated by ($C_{9*3+2=29}$) is zero, etc. The resulting pattern is densely present but not 100% complete, because there are 4 occasions ({C(k) for k=136, 460, 784, 1108}) when the polynomial is not punctured, breaking the pattern as can be seen in FIG. 6.

Figure 8:
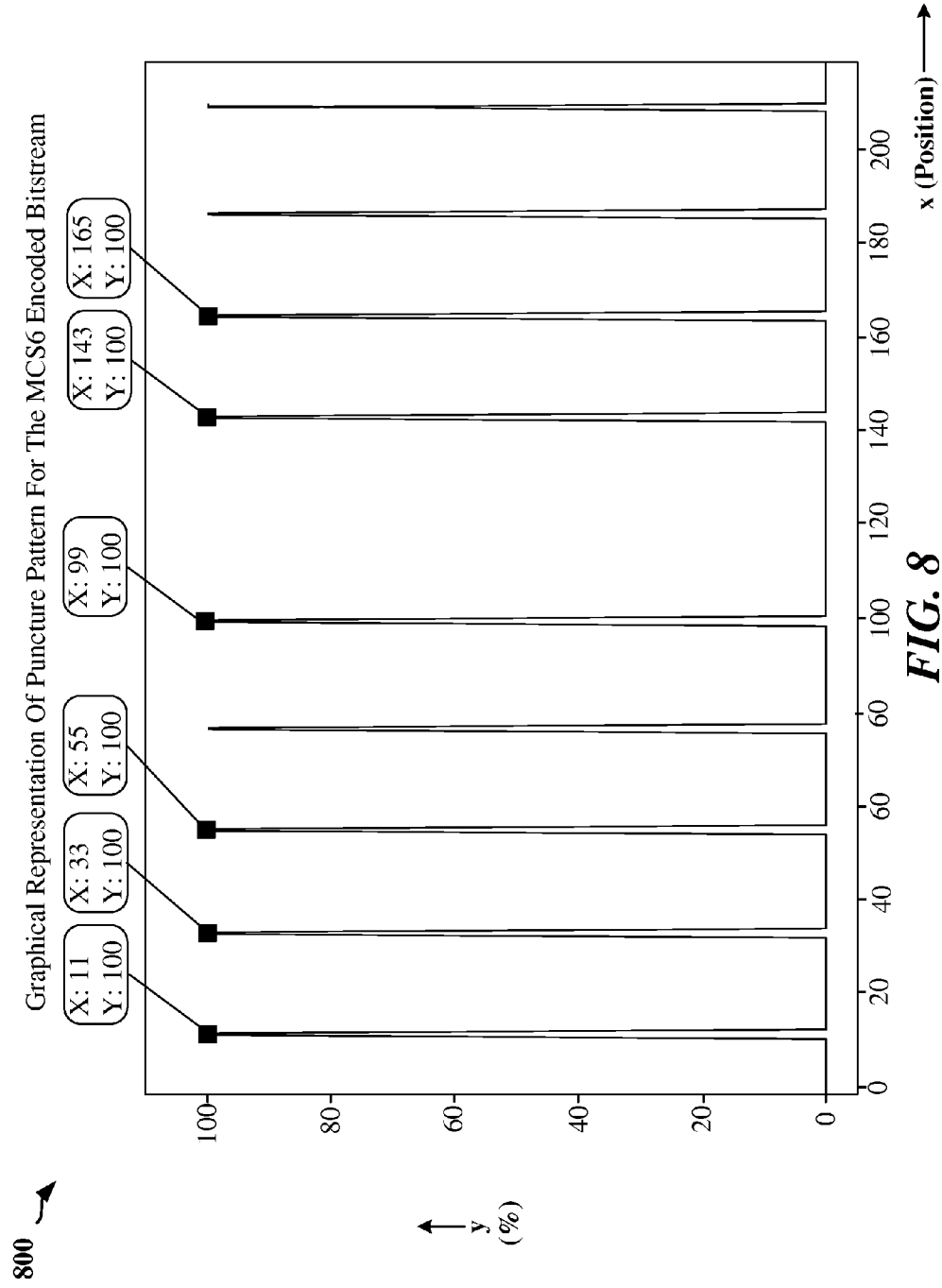
FIG. 8 is a graphical representation of a puncture pattern for the MCS6 encoded bitstream of FIG. 7 according to some embodiments of the present invention.
Figure 10:
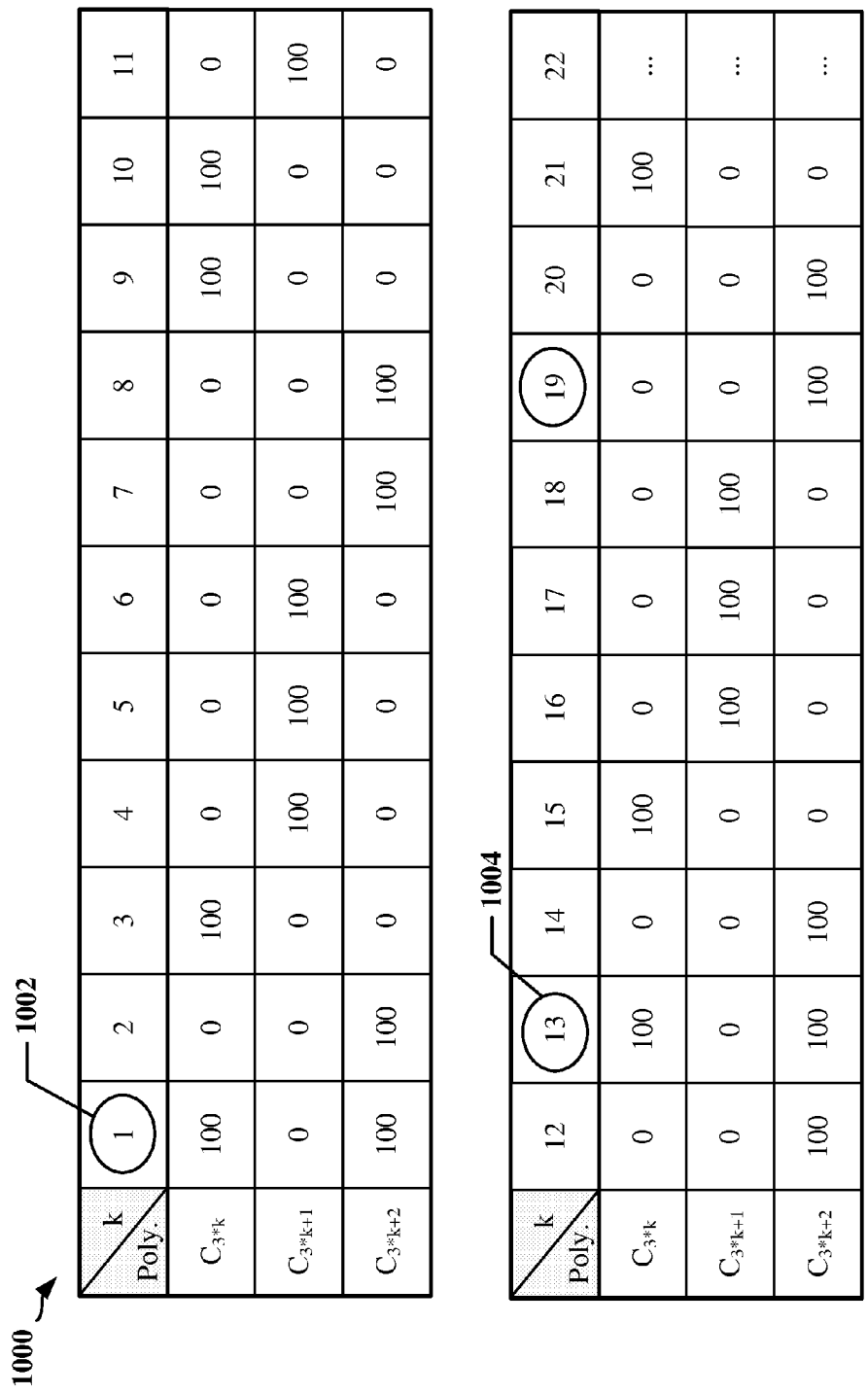
FIG. 10 is a table illustrating an example of puncturing in an MCS8 encoded bitstream according to some embodiments of the present invention.
Figure 11:
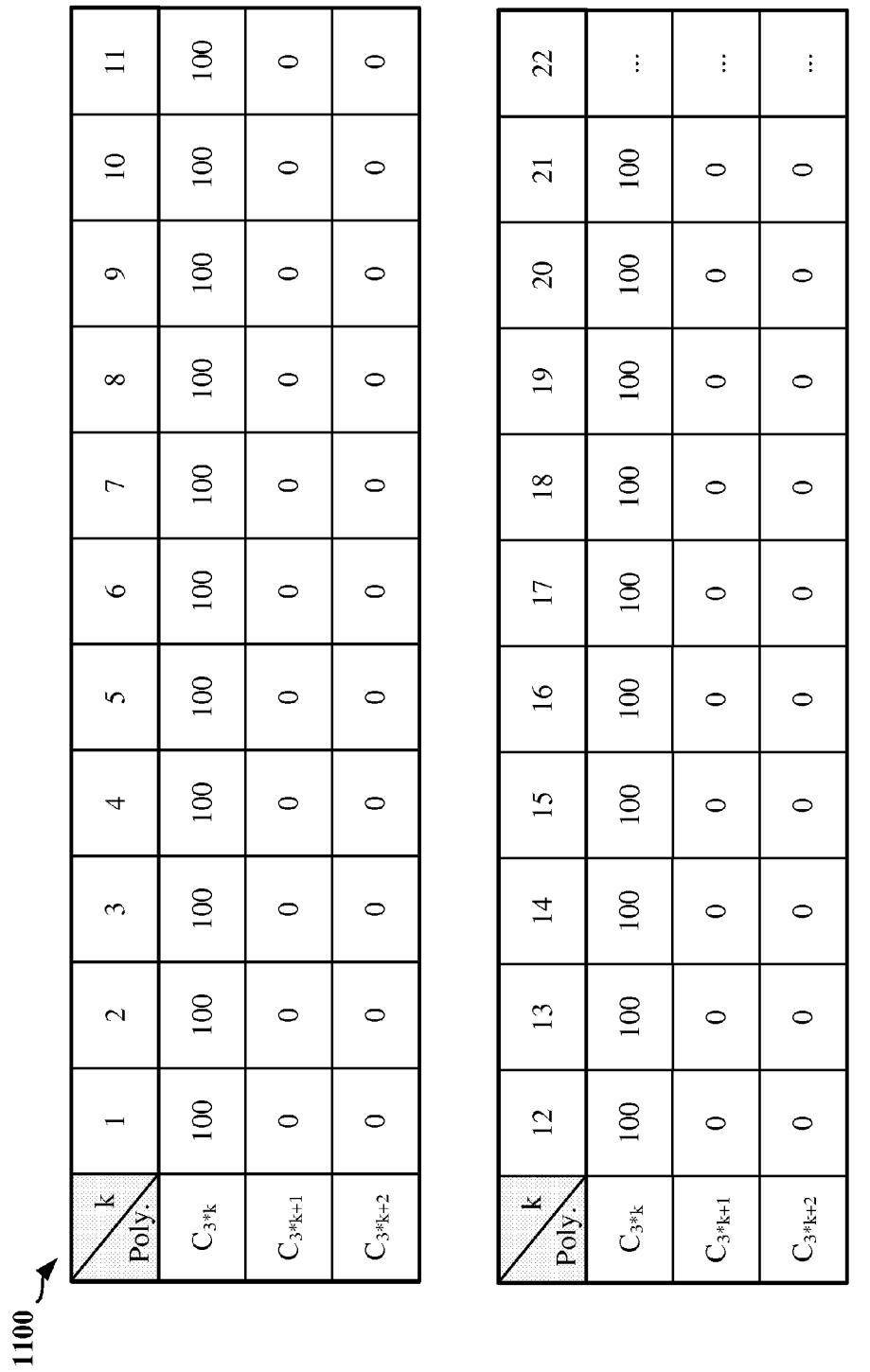
FIG. 11 is a table illustrating an example of puncturing in an MCS9 encoded bitstream according to some embodiments of the present invention.

FIGS. 7 and 8 relate to an example of a puncturing pattern matrix 700 corresponding to MCS6/P1. Here, all indices in the third polynomial ($C_{3*k+2}$) are punctured except for every 22$^{nd}$ position. However, there are four instances when this 22$^{nd}$ position is also punctured. FIGS. 9, 10 and 11 illustrate the puncturing pattern matrices 900, 1000, and 1100 corresponding to MCS7/P1, MCS8/P1, and MCS9/P1, respectively. MCS7 900 has frequently repeating patterns every 6 columns 902, 904, 906, and 908, with 9 breaks in the pattern. MCS8 1000 has a frequently repeating pattern every 12 columns 1002, 1004, and with 2 breaks in the pattern. MCS9 1100 has all indices in the second and third polynomial punctured, except for the last 2 indices.

According to certain aspects disclosed herein, and with continued reference to FIG. 4, a receiver may be configured to ignore punctured LLRs 428 associated with a bitstream 424. The receiver may identify the encoding scheme used to encode a bitstream, and may then identify a puncturing pattern 410 corresponding to the encoding scheme. In one example, the encoding scheme to be used in a RF channel may be selected by a network entity and communicated between a transmitter and a receiver by exchange of control information. Having determined the encoding scheme used, the receiver may determine whether the received bitstream 424 is punctured and may identify the puncturing pattern 410 when the bitstream 424 is punctured.

In one example, a transmitter and a receiver may exchange control information that determines which puncturing pattern 410 is used. In another example, the receiver may determine the puncturing pattern 410 by pattern matching using one or more candidate patterns. The receiver may maintain information identifying possible puncturing patterns for each encoding scheme. For each pattern, the receiver may parse the received bitstream to determine if non-zero LLRs occur at all locations corresponding to punctured locations in a puncturing pattern 410, and may thereby determine that a particular puncturing pattern 410 is in use. In certain examples, the receiver may maintain a database and/or one or more tables describing the puncturing patterns for each encoding scheme. In one example, the tables may be in the form of a mask, having zero values at locations that are to be punctured when the puncturing pattern 410 is used. In certain examples, punctured and non-punctured locations are described algorithmically in order to minimize the amount of storage required to maintain the puncturing patterns.

Figure 12:
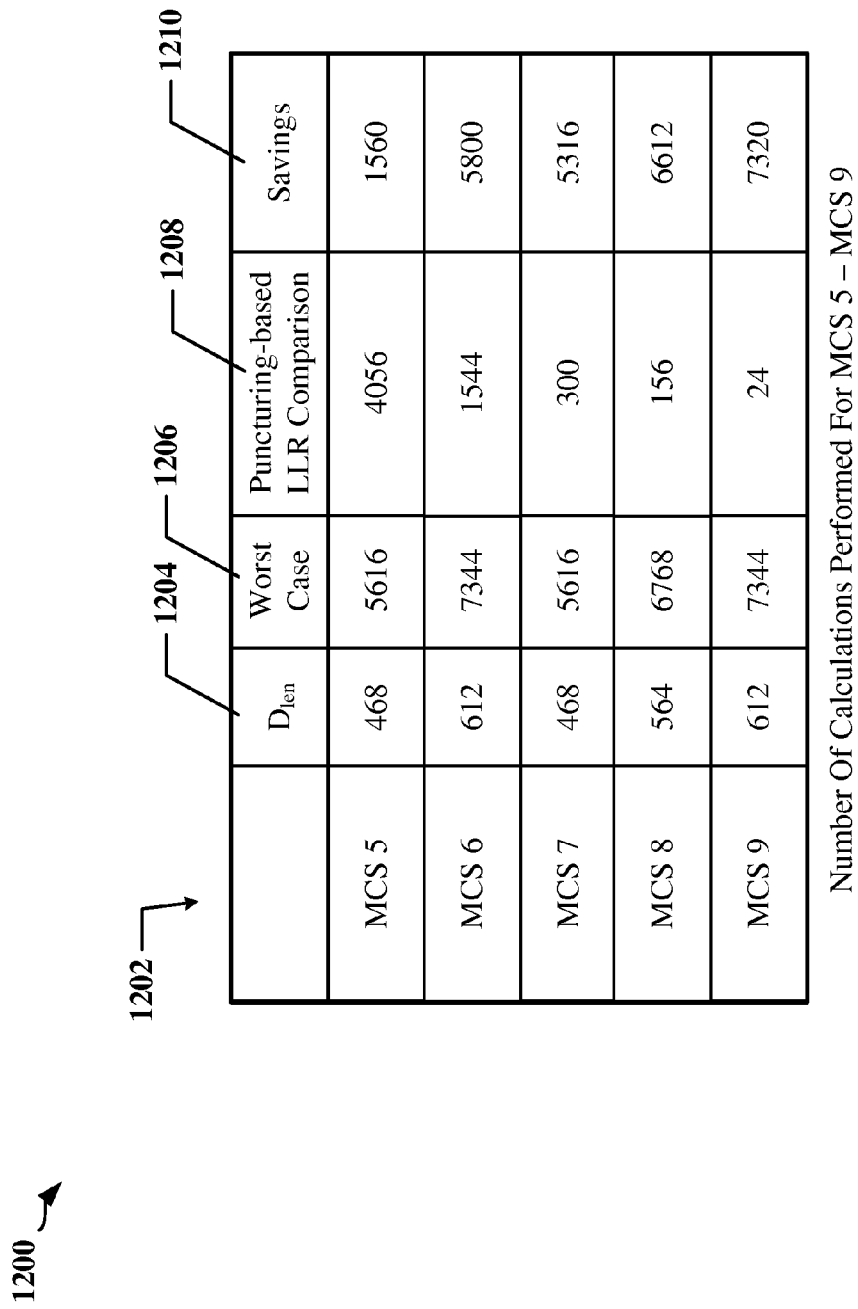
FIG. 12 is a table illustrating efficiency gains obtained using a decoder adapted according to some embodiments of the present invention.

Using the knowledge of the puncturing pattern 410, a decoder 408 in the receiver may ignore some or all punctured LLRs 428 in the depunctured bitstream 424, thereby reducing the processing required to decode the bitstream 424. FIG. 12 is a table 1200 that illustrates numbers of calculations that may be performed while decoding a bitstream encoded using different MCSs (1202). In the example, the maximum number of calculations 1206 for each MCS 1202 exceeds the number of calculations 1208 needed when the punctured LLRs 428 are ignored. The time and power conserved may be estimated based on the potential number of calculations 1210 that need not be performed. The number of processing cycles required for conventional schemes and puncturing-based schemes disclosed herein may be used to estimate time and power savings. In one example, one comparison may include two processing cycles. The number of processing cycles for a conventional decoder is CYCLE*6*$D_{len}$, where $D_{len}$ (indicated in FIG. 12 at 1204) is the data length. In one example, the worst case decoding for a 612 bit MCS6 encoded bitstream is 7344 processing cycles. When the punctured LLRs 428 are ignored, the required processing cycles may be calculated as CYCLE*(6*N+1*S+0*D), where N is the number of indices have no punctured locations, S is the number of indices having a single punctured location and D is the number of locations having double puncture locations.

According to certain aspects of the present disclosure, a modem of an access terminal or base station may be adapted to recognize puncturing patterns in an encoding system used to encode a received bitstream. A decoder of the modem may then ignore punctured LLRs in the bitstream and thereby improve efficiency of bitstream decoding.

Figure 13:
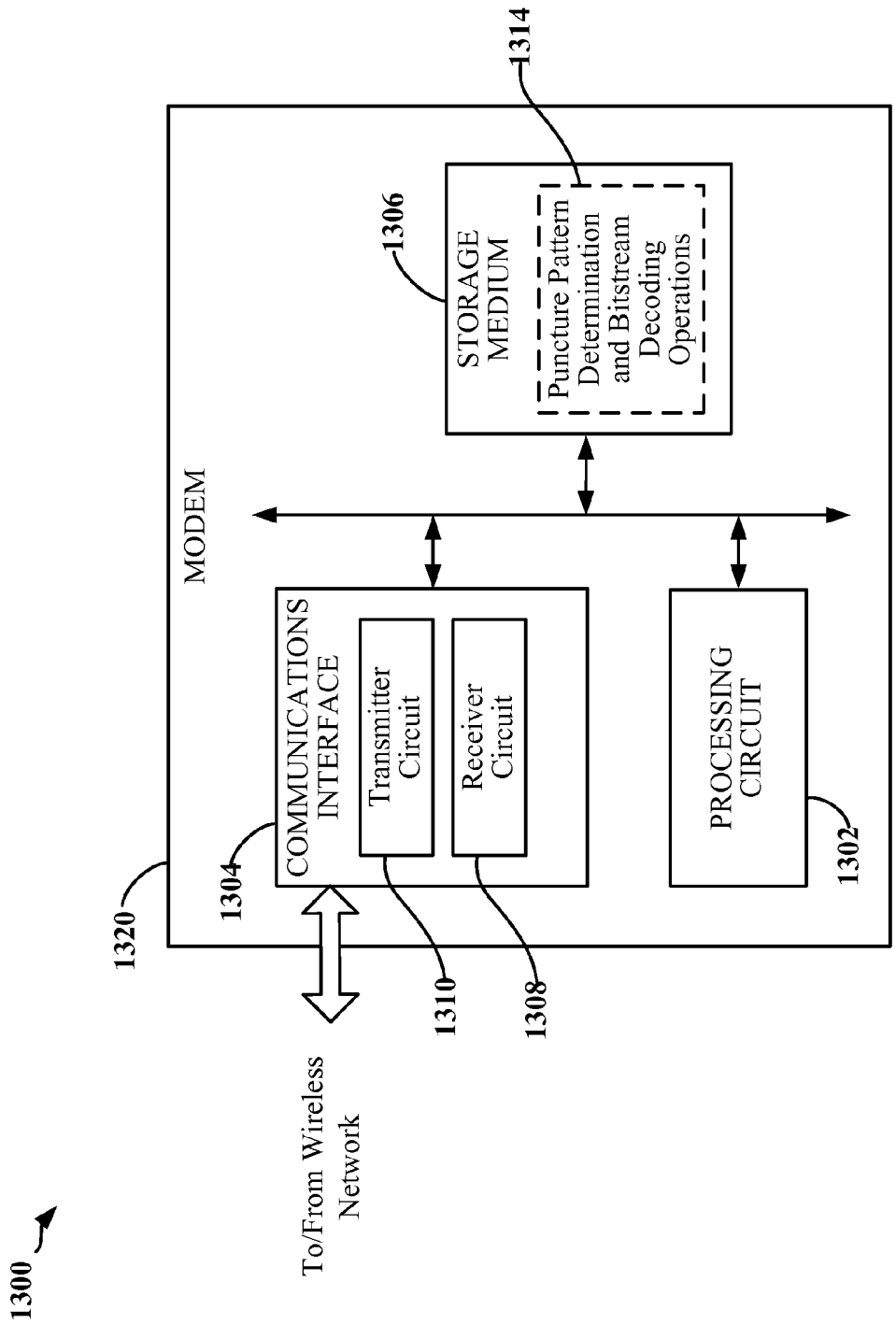
FIG. 13 is a block diagram illustrating select components of modem according to some embodiments of the present invention.

FIG. 13 is a block diagram of an apparatus 1300 illustrating select components of a modem 1320 according to at least one example. As illustrated, the modem 1320 may include a processing circuit 1302 coupled to, or placed in electrical communication with a communications interface 1304 and a storage medium 1306. The components and functions discussed in concert with FIG. 13 (and the other Figures), can serve as means components/embodiments for implementing other arrangements of the technology.

The processing circuit 1302 is arranged to obtain, process and/or send data, control data access and storage, issue commands, and control other desired operations. The processing circuit 1302 may include circuitry adapted to implement desired programming provided by appropriate storage media in at least one example. For example, the processing circuit 1302 may be implemented as one or more processors, one or more controllers, and/or other structure configured to execute executable instructions and operate on stored data based on programming characterized by the instructions. Examples of the processing circuit 1302 may include a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 1302 may also be implemented as a combination of computing components, such as a combination of a DSP and a microprocessor, a number of microprocessors, one or more microprocessors in conjunction with a DSP core, an ASIC and a microprocessor, or any other number of varying configurations. These examples of the processing circuit 1302 are for illustration and other suitable configurations within the scope of the present disclosure are also contemplated.

The processing circuit 1302 is adapted for processing, including the execution of programming, which may be stored on the storage medium 1306. As used herein, the term "programming" shall be construed broadly to include without limitation instructions, instruction sets, data, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The communications interface 1304 is configured to facilitate wireless communications of the access terminal 1300. For example, the communications interface 1304 may include circuitry and/or programming adapted to facilitate the communication of information bi-directionally with respect to one or more network nodes. The communications interface 1304 may be coupled to one or more antennas (not shown), and includes wireless transceiver circuitry, including at least one receiver circuit 1308 (e.g., one or more receiver chains) and/or at least one transmitter circuit 1310 (e.g., one or more transmitter chains). By way of example and not limitation, the at least one receiver circuit 1308 may include circuitry, devices and/or programming associated with a data path (e.g., antenna, amplifiers, filters, mixers) and with a frequency path (e.g., a phase-locked loop (PLL) component).

The storage medium 1306 may represent one or more computer-readable, machine-readable, and/or processor-readable devices for storing programming, such as processor executable code or instructions (e.g., software, firmware), electronic data, databases, or other digital information. The storage medium 1306 may also be used for storing data that is manipulated by the processing circuit 1302 when executing programming. The storage medium 1306 may be any available media that can be accessed by a general purpose or special purpose processor, including portable or fixed storage devices, optical storage devices, and various other mediums capable of storing, containing and/or carrying programming By way of example and not limitation, the storage medium 1306 may include a computer-readable, machine-readable, and/or processor-readable storage medium such as a magnetic storage device (e.g., hard disk, floppy disk, magnetic strip), an optical storage medium (e.g., compact disk (CD), digital versatile disk (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, a removable disk, and/or other mediums for storing programming, as well as any combination thereof.

The storage medium 1306 may be coupled to the processing circuit 1302 such that the processing circuit 1302 can read information from, and write information to, the storage medium 1306. That is, the storage medium 1306 can be coupled to the processing circuit 1302 so that the storage medium 1306 is at least accessible by the processing circuit 1302, including examples where the storage medium 1306 is integral to the processing circuit 1302 and/or examples where the storage medium 1306 is separate from the processing circuit 1302 (e.g., resident in the apparatus 1300, external to the apparatus 1300, and/or distributed across multiple entities).

Programming stored by the storage medium 1306, including data and instructions that when executed by the processing circuit 1302, cause the processing circuit 1302 to perform one or more of the various functions and/or process steps described herein. For example, the storage medium 1306 may include puncture pattern recognition and bitstream decoding operations 1314. The puncture pattern recognition and bitstream decoding operations 1314 can be implemented by the processing circuit 1302 and/or by a processor in the communications interface 1304. Programming stored in the storage medium 1306 when executed by the processing circuit 1302 may cause the processing circuit to interact with hardware logic, sequencers and other devices and circuits to enable performance of the functions of convolutional decoder. In one example, the modem 1320 comprises modules and circuits configured to extract a bitstream from a signal received from a wireless network with a wireless network, modules and circuits configured to determine a puncture pattern associated with an MCS used to encode a message received in the bitstream, modules and circuits configured to decode the message without using a plurality of LLRs identified by the puncture pattern as corresponding to punctured locations in the bitstream, and modules and circuits configured to determine the MCS used to encode the bitstream. The puncture pattern may be one of a plurality of puncture patterns associated with the MCS maintained in the storage medium 1304.

Thus, according to one or more aspects of the present disclosure, the processing circuit 1302 may be adapted to perform (in conjunction with the storage medium 1306) any or all of the processes, functions, steps and/or routines for any or all of the access terminals 104 described herein. As used herein, the term "adapted" in relation to the processing circuit 1302 may refer to the processing circuit 1302 being one or more of configured, employed, implemented, and/or programmed (in conjunction with the storage medium 1306) to perform a particular process, function, step and/or routine according to various features described herein.

Figure 14:
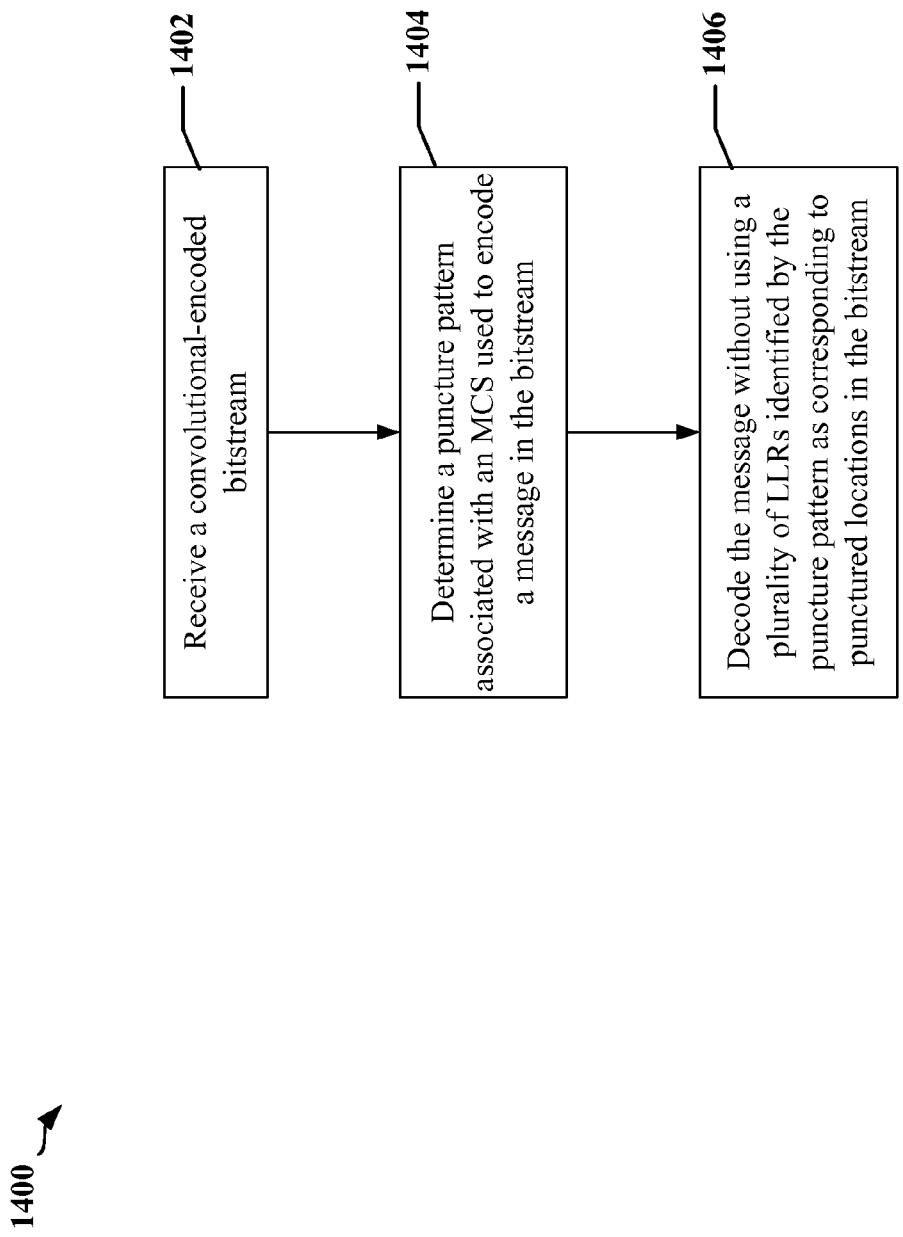
FIG. 14 is a flow diagram illustrating a method operational on an access terminal or base station according to some embodiments of the present invention.

According to at least one aspect of the present disclosure, methods operational on an access terminal or base station are provided for puncturing scheme based decoder optimizations. FIG. 14 is a flow diagram 1400 illustrating a method operational in a communications interface comprising, for example, a modem 1320 (see FIG. 13) of an access terminal 104, or a base station 102, in accordance with certain aspects disclosed herein.

At step 1402, the modem 1320 may receive a transmission comprising a bitstream encoded according to a convolutional code.

At step 1404, the modem 1320 may determine a puncture pattern associated with an MCS used to encode a message received in the bitstream. The puncture pattern may be characterized by one or more algorithms that identify a repetitive sequence of LLRs comprising punctured LLRs.

At step 1406, the modem 1320 may decode the message without using a plurality of LLRs identified by the puncture pattern as corresponding to punctured locations in the bitstream. The modem 1320 may ignore a plurality of LLRs generated from the bitstream while decoding the bitstream. The modem may ignore the plurality of LLRs by refraining from performing calculations using one or more of the plurality of LLRs. The plurality of LLRs that are ignored may correspond to a plurality of punctured LLRs defined in the puncture pattern. The puncture pattern may comprise an incomplete pattern in which at least one of the sequence of LLRs includes a valid LLR.

According to certain aspects disclosed herein, the modem 1320 may determine the MCS used to encode the bitstream. The puncture pattern may be one of a plurality of puncture patterns associated with the MCS. The MCS and the puncture pattern may be determined based on signaling between a base station and an access terminal.

According to certain aspects disclosed herein, the modem 1320 may be provided or deployed in an access terminal or a base station. A Viterbi decoder may be used to decode the bitstream. An algebraic decoder may be used to decode the bitstream.

While the above discussed aspects, arrangements, and embodiments are discussed with specific details and particularity, one or more of the components, steps, features and/or functions illustrated in FIGS. 1-4, 13 and/or 14 may be rearranged and/or combined into a single component, step, feature or function or embodied in several components, steps, or functions. Additional elements, components, steps, and/or functions may also be added or not utilized without departing from the invention. The apparatus, devices and/or components illustrated in FIGS. 1-4 and/or 13 may be configured to perform or employ one or more of the methods, features, parameters, or steps described in FIG. 14. The novel algorithms described herein may also be efficiently implemented in software and/or embedded in hardware.

Also, it is noted that at least some implementations have been described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function. The various methods described herein may be partially or fully implemented by programming (e.g., instructions and/or data) that may be stored in a machine-readable, computer-readable, and/or processor-readable storage medium, and executed by one or more processors, machines and/or devices.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Those of skill in the art would further appreciate that the various illustrative logical blocks, modules, circuits, and algorithm steps described in connection with the embodiments disclosed herein may be implemented as hardware, software, firmware, middleware, microcode, or any combination thereof. To clearly illustrate this interchangeability, various illustrative components, blocks, modules, circuits, and steps have been described above generally in terms of their functionality. Whether such functionality is implemented as hardware or software depends upon the particular application and design constraints imposed on the overall system. If implemented in software, functions can be stored on or transmitted over as one or more instructions or code on a computer-readable medium. Computer-readable media includes both computer storage media and communication media including any medium that facilitates transfer of a computer program from one place to another. A storage media can be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, DVD, floppy disk and blu-ray disc (BD), where disks usually reproduce data magnetically and discs reproduce data optically with lasers. Combinations of the above should also be included within the scope of computer-readable media.

The various features associate with the examples described herein and shown in the accompanying drawings can be implemented in different examples and implementations without departing from the scope of the present disclosure. Therefore, although certain specific constructions and arrangements have been described and shown in the accompanying drawings, such embodiments are merely illustrative and not restrictive of the scope of the disclosure, since various other additions and modifications to, and deletions from, the described embodiments will be apparent to one of ordinary skill in the art. Thus, the scope of the disclosure is only determined by the literal language, and legal equivalents, of the claims which follow.

What is claimed is:

1. In a wireless communication device having a modem, the modem comprising:
   a receiver circuit; and
   a decoder coupled to the receiver circuit, wherein the decoder is configured to:
      use a pattern recognition algorithm to determine a puncture pattern in a bitstream received by the receiver circuit, the puncture pattern being associated with a modulation and coding scheme (MCS) used to encode a message transmitted in the bitstream; and
      ignore a plurality of log-likelihood ratios (LLRs) generated from the bitstream while decoding the message, wherein the ignored plurality of states corresponds to a plurality of punctured LLRs defined in the puncture pattern.

2. The modem of claim 1, wherein the puncture pattern is one of a plurality of puncture patterns associated with the MCS.

3. The modem of claim 1, wherein the puncture pattern is determined when punctured locations are found as predicted by one or more pattern recognition algorithms in signaling between a base station and an access terminal.

4. The modem of claim 1, wherein the encoder is configured to determine the puncture pattern by matching a pattern of nulls in the bitstream with puncture locations defined by one or more of a plurality of puncture patterns.

5. The modem of claim 1, wherein the puncture pattern is characterized by one or more algorithms, including at least one algorithm identifying a repetitive sequence of punctured LLRs.

6. The modem of claim 5, wherein the puncture pattern is an incomplete pattern in which the sequence of LLRs includes at least one valid LLR.

7. The modem of claim 1, wherein the decoder is configured to ignore the plurality of LLRs by refraining from performing at least one calculation involving each of the ignored plurality of LLRs.

8. The modem of claim 1, wherein the decoder comprises a Viterbi decoder or an algebraic decoder.

9. The modem of claim 1, wherein the modem is provided in an access terminal or a base station.

10. A method for decoding a bitstream, comprising:
   using a pattern recognition algorithm to determine a puncture pattern associated with a modulation and coding scheme (MCS) used to encode a message received in the bitstream; and
   decoding the message without using a plurality of log-likelihood ratios (LLRs) identified by the puncture pattern as corresponding to punctured locations in the bitstream.

11. The method of claim 10, further comprising:
   determining the MCS used to encode the bitstream, wherein the puncture pattern is one of a plurality of puncture patterns associated with the MCS, and wherein the MCS and the puncture pattern are determined when punctured locations are found as predicted by one or more pattern recognition algorithms in signaling between a base station and an access terminal.

12. The method of claim 10, wherein the pattern recognition algorithm is configured to determine the puncture pattern by matching a pattern of nulls in the bitstream with puncture locations defined by one or more of a plurality of puncture patterns associated with the MCS.

13. The method of claim 10, wherein the puncture pattern is characterized by one or more algorithms identifying a repetitive sequence of LLRs comprising punctured LLRs.

14. The method of claim 13, wherein the puncture pattern is an incomplete pattern in which the sequence of LLRs includes at least one valid LLR.

15. The method of claim 10, wherein decoding the message includes: refraining from performing calculations involving the plurality of LLRs identified by the puncture pattern.

16. The method of claim 10, wherein decoding the message includes: processing the bitstream using a Viterbi decoder or an algebraic decoder to decode the bitstream.

17. In a wireless communication device having a modem, the modem comprising:
   means for extracting a bitstream from a signal received from a wireless network;
   means for determining a puncture pattern associated with a modulation and coding scheme (MCS) used to encode a message received in the bitstream, the means for determining the puncture pattern including one or more pattern recognition algorithms configured to recognize a pattern of nulls in the bitstream; and
   means for decoding the message without using a plurality of log-likelihood ratios (LLRs) identified by the puncture pattern as corresponding to punctured locations in the bitstream.

18. The modem of claim 17, further comprising:
   means for determining the MCS used to encode the bitstream, wherein the puncture pattern is one of a plurality of puncture patterns associated with the MCS, and wherein the MCS and the puncture pattern are determined when punctured locations are found as predicted by one or more pattern recognition algorithms in signaling between a base station and an access terminal.

19. The modem of claim 17, wherein the means for determining the puncture pattern is configured to match a pattern of nulls in the bitstream with puncture locations defined by one or more of a plurality of puncture patterns associated with the MCS.

20. The modem of claim 17, wherein the puncture pattern is characterized by one or more algorithms identifying a repetitive sequence of LLRs comprising punctured LLRs.

21. The modem of claim 20, wherein the puncture pattern is an incomplete pattern in which the sequence of LLRs includes at least one valid LLR.

22. The modem of claim 17, wherein the means for decoding the message is configured to refrain from performing calculations involving the plurality of LLRs identified by the puncture pattern.

23. The modem of claim 17, wherein the means for decoding the message is configured to process the bitstream using a Viterbi decoder or an algebraic decoder.

24. A non-transitory computer-readable storage medium contained on a storage device, comprising programming for causing a processing circuit to:
   use a pattern recognition algorithm to determine a puncture pattern associated with a modulation and coding scheme (MCS) used to encode a message received in a bitstream received from a wireless network; and decode the message without using a plurality of log-likelihood ratios (LLRs) identified by the puncture pattern as corresponding to punctured locations in the bitstream.

25. The computer-readable storage medium of claim 24, further comprising programming for causing the processing circuit to:

determine the MCS used to encode the bitstream, wherein the puncture pattern is one of a plurality of puncture patterns associated with the MCS, and wherein the MCS and the puncture pattern are determined when punctured locations are found as predicted by one or more pattern recognition algorithms in signaling between a base station and an access terminal.

26. The computer-readable storage medium of claim 24, wherein the pattern recognition algorithm is used to determine the puncture pattern by matching a pattern of nulls in the bitstream with puncture locations defined by one or more of a plurality of puncture patterns associated with the MCS.

27. The computer-readable storage medium of claim 24, wherein the puncture pattern is characterized by one or more algorithms identifying a repetitive sequence of LLRs comprising punctured LLRs.

28. The computer-readable storage medium of claim 27, wherein the puncture pattern is an incomplete pattern in which the sequence of LLRs includes at least one valid LLR.

29. The computer-readable storage medium of claim 24, wherein the processing circuit decodes the message without using the plurality of LLRs identified by the puncture pattern by refraining from performing calculations involving the plurality of LLRs identified by the puncture pattern.

30. The computer-readable storage medium of claim 24, wherein the processing circuit decodes the message by causing the bitstream to be processed by a Viterbi decoder or an algebraic decoder.

* * * * *